(12) United States Patent
Ezell

(10) Patent No.: US 6,771,124 B1
(45) Date of Patent: Aug. 3, 2004

(54) SYSTEM AND METHOD FOR LOW-NOISE AMPLIFIER WITH A HIGH FREQUENCY RESPONSE

(75) Inventor: Richard William Ezell, Carrollton, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 09/631,743

(22) Filed: Aug. 4, 2000

(51) Int. Cl.[7] .............................................. H03G 3/20
(52) U.S. Cl. .................... 330/129; 330/133; 330/134; 330/254; 330/285; 327/359
(58) Field of Search ................ 330/129, 133, 330/134, 254, 285; 327/359

(56) References Cited

U.S. PATENT DOCUMENTS

| | | | |
|---|---|---|---|
| 3,761,741 A | 9/1973 | Hoeft | 307/237 |
| 4,277,757 A | 7/1981 | Kennedy | |
| 4,344,044 A | 8/1982 | Harford | 330/254 |
| 4,415,864 A | 11/1983 | Boeke | 330/253 |
| 4,751,474 A | 6/1988 | Gola | |
| 4,929,908 A | 5/1990 | Imanishi | 330/254 |
| 4,961,057 A * | 10/1990 | Ibukuro | 330/295 |
| 5,610,557 A | 3/1997 | Jett, Jr. | 330/261 |
| 5,994,955 A | 11/1999 | Birkeland | 330/51 |
| 6,049,251 A * | 4/2000 | Meyer | 330/254 |
| 6,100,761 A * | 8/2000 | Ezell | 330/254 |
| 6,211,745 B1 | 4/2001 | Mucke et al. | 331/117 R |
| 6,218,899 B1 * | 4/2001 | Ezell | 330/254 |
| 6,285,865 B1 | 9/2001 | Vorenkamp et al. | 455/307 |

FOREIGN PATENT DOCUMENTS

| | | |
|---|---|---|
| EP | 0 514 655 | 11/1992 |
| EP | 0 777 319 A1 | 6/1997 |
| JP | 60 096012 | 5/1985 |
| JP | 2-100407 | 4/1990 |
| WO | WO 0021205 | 4/2000 |

OTHER PUBLICATIONS

IEEE Standard Dictionary of Electrical and Electronics Terms, Third Edition pp. 371–372.*
International Search Report issued Oct. 4, 2002 PCT/US 01/24175.
"A 1–GHz BiCMOS RF Front–End IC" Robert Meyer; IEEE Journal of Solid–State Circuits, vol. 29 No. 3 pp. 350–355 (Mar. 1994).
"An Advanced I.F. Amplifier & AFT System Suitable for HDTV" Mike McGinn; IEEE Transactions on Consumer Electronics, vol. 36 No. 3 pp. 407–414 (Aug. 1990).
"High Linearity HBT Amplifier Targets Multicarrier Systems" William Pratt pp. 47–54 (Mar. 1996).
"The LM 1823: A High Quality TV Video I.F. Amplifier and Synchronous Detector for Cable Receivers" Martin Giles; National Semiconductor Corporation pp. 1–16 (Mar. 1985).
"The Ultra–Multi–Tanh Technique for Bipolar Linear Transconductance Amplifiers" Katsuji Kimura; IEEE Transactions on Circuits and Systems–1: Fundamental Theory and Applications, vol. 44 No. 4 pp. 288–302 (Apr. 1997).
International Search Report , PCT/US99/23053.
The Designer's Guide to Spice and Spectre; Kenneth S. Kundert; p. 255; dated 1995.

* cited by examiner

Primary Examiner—Michael B. Shingleton
(74) Attorney, Agent, or Firm—Fulbright & Jaworski LLP

(57) ABSTRACT

A variable gain low noise amplifier is disclosed that offers flat gain versus frequency throughout the entire cable and broadcast television signal spectrum. The circuit uses multiple stages and buffering techniques to cancel the primary source of high frequency gain degradation. The invention also uses variable capacitor networks which track with gain control to control peaking within the circuit so as to have consistent gain control with frequency and gain. A further aspect of the invention is in the use of capacitors within the circuit to act as simple band-pass filters to roll off segments of the spectrum away from the channel of interest, thus reducing system-level distortion in a receiver.

75 Claims, 10 Drawing Sheets

SYSTEM AND METHOD FOR LOW-NOISE AMPLIFIER WITH A HIGH FREQUENCY RESPONSE

RELATED APPLICATIONS

This application is related to application serial number 09/167,350, titled, HIGHLY LINEAR VARIABLE-GAIN LOW NOISE AMPLIFIER, filed on Oct. 7, 1998, and to application Ser. No. 09/548,071, titled METHOD FOR A HIGHLY LINEAR VARIABLE-GAIN LOW NOISE AMPLIFIER, filed on Apr. 1, 2000, both of which are incorporated herein by reference.

TECHNICAL FIELD

This invention relates to amplifiers and amplifier circuits used in tuners, and more specifically to variable gain low noise amplifiers.

BACKGROUND

U.S. Pat. 5,737,035 dated Apr. 7, 1998, shows a tuner circuit. The front end of such a tuner requires a broadband, highly linear Variable-gain Low Noise Amplifier (VLNA).

The VLNA's input comes from either an antenna for wireless broadcasts or from a coaxial cable for cable transmission. The output of the VLNA supplies the input of the first up-converting mixer. The noise figure specification for the VLNA is highly critical, and has the highest impact on the overall noise figure of the system. Non-linearities of the amplifier also have a large effect on the proper operation of the tuner.

LNA's are typically used to meet the narrow-band requirements of cellular systems.

However, a television tuner must generally receive carriers from 50 MHZ to over 860 MHz. A narrow bandwidth system also typically has less stringent linearity specifications because fewer intermodulation distortion products fall in-band. Finally, because the incoming signal power to a tuner may vary by many orders of magnitude, an LNA must have a continuously-variable gain. This gain variability function adds noise, distortion, and complexity to the LNA.

FIG. 1A shows an LNA. In its basic form, the differential transistors, 1Q1 and 1Q2 are supplied with DC voltage through 1 Vcc and biased with 1Vb and resistors 1Rb. The variable collector and emitter resistors, 1Rc and 1Re are used to control the gain of the amplifier. At low frequencies, the gain of the FIG. 1A amplifier is generally set by the formula:

$$\frac{1Rc}{1Re} \tag{1}$$

However, at high frequencies, inherent parasitic capacitances usually arise in many of the amplifier components which limit its frequency response.

These capacitances are inherent in the devices themselves. They arise generally due to the operating characteristics of semiconductor materials. Therefore, little can be done to change their existence. FIG. 1B shows a figurative representation of the device-specific high-frequency capacitances. In the bipolar transistors shown in FIG. 1B, capacitances typically arise between the collector and base terminals, 1 $C\mu$. Capacitances also usually arise in the variable resistors, 1Cc and 1Ce. Therefore, capacitors would typically shunt both the collector and emitter resistors. A capacitor across 1Rc will generally limit the frequency response, which essentially creates a low pass filter on the output signal. Conversely, a capacitor across 1Re will generally increase the overall gain of the amplifier in addition to increasing the frequency response, which essentially creates a high pass filter on the output signal. The combined effect generally limits the bandwidth of the amplifier. However, an ideal VLNA should preferably have a flat response without a high- or low-pass filtering effect.

As referenced above, a VLNA may be used in tuner applications to amplify the incoming channel signal. Therefore, it may have to amplify up to 133 different channel signals in a linear manner. With so many signals entering the amplifier, each channel could generally interact with other channel frequencies creating intermodulation distortion and harmonics. For this reason, narrow bandwidth VLNAs typically have less stringent linearity requirements than wide-bandwidth LNAs.

Another method generally used to avoid the intermodulation distortion and harmonics is to place an inductor-capacitor (LC) tracking filter on the front-end of the tuner. The LC tracking filter is typically tuned to allow fewer channels into the remainder of the tuner. Allowing fewer channels into the tuner generally reduces the chances for intermodulation and relaxes the linearity requirements for the rest of the amplifier circuit. With this method, the LC tracking filter must usually be highly selective, meaning that it must precisely filter to within a small frequency range. It must also be generally able to tune its center frequency over a wide frequency range. In order to accomplish these requirements, large inductors and extensive circuitry must typically be used. However, because inductors are not easily fabricated using integrated circuit technology, selective LC filters are generally not well-suited for integrated circuit (IC) applications. Large, high-quality inductors and capacitors are also more expensive and substantially larger than devices typically fabricated on IC substrates, thereby making the addition of such elements a large percentage of the manufacturing expense and undesirably increasing the size requirement of the entire circuit application.

SUMMARY OF THE INVENTION

Considering the problems inherent to the current state of VLNAs, it would be advantageous to have a variable gain low noise amplifier which has a wide and variable bandwidth with good high frequency response, good linear amplification, and suited for fabrication substantially on a single integrated circuit substrate.

These and other features and technical advantages are achieved by a system and method which increases the bandwidth and high frequency response of a VLNA by dividing the amplifier into at least two lower-gain amplification stages and adding a linearly-variable capacitance to the second stage which essentially compensates for the spectral effect of the circuit's inherent parasitic capacitances. The system and method also provides a mechanism to maintain high input or output linearity relative to the type of signals being amplified.

To reduce the effective capacitance on the amplifier, it is preferably divided into at least two stages, each of which has a lower gain than an equivalent single stage VLNA. In a two stage device, variable common terminal resistors are preferably added to the first stage, while variable load resistors are added to the output stage. All of the remaining resistors in the VLNA are constant value components. The output stage also preferably includes a variable capacitance which compensates for the inherent capacitance of the amplifier circuit elements. By implementing the reduced gain of each individual amplification stage, reducing the total number of variable resistors per stage, and adding the variable capacitance, the bandlimiting effect of the overall circuit capacitance is reduced, thus increasing, or at least maintaining, the amplifier's overall bandwidth and improving the high frequency response.

The present invention also maintains high application-specific linearity through its method of varying the gain of the amplifier. For signals requiring a high input linearity, the amplifier adjusts gain by varying the load resistors of the output stage, while keeping the common terminal resistors of the input stage constant. Conversely, for signals requiring high output linearity, the amplifier adjusts gain by varying the common terminal resistors of the input stage, while keeping the load resistors of the output stage constant.

In order to maintain linearity of the varied resistance and capacitance of the circuit, the invention preferably provides for a network of resistors coupled to resistor-associated MOSFET transistors such that successively varying the control voltages for each resistor-related MOSFET device varies the effective resistance of the device, thus, adding or subtracting resistance to the circuit path. This method and system for varying resistance results in a linear and predictable variation. Similarly, the invention preferably provides a network of capacitors coupled to capacitor-related MOSFET transistors such that switching on the connected capacitor-associated MOSFET devices adds the capacitance of the associated capacitor to the circuit path. As with the variable resistor configuration, as the control voltages move the MOSFETs between on and off states, the varied effective resistance in the MOSFET triode region of operation preferably varies the amount of capacitance added to or subtracted from the circuit. Varying the capacitance in this preferred manner provides linear and predictable changes in circuit capacitance.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

The capacitance generally inherent in bipolar transistors between the base and collector terminals essentially creates a feedback between the device input and output. In field effect transistors (FET), this parasitic feedback capacitance typically arises between the gate and the drain. Because this capacitance connects the input and output regions of the device, its contribution to the circuit is usually magnified by operation of Miller's Theorem. Miller's Theorem generally states that this feedback capacitance is equivalent to the sum of two "Miller" capacitors, one in the input network and one in the output network. The values of these input and output "Miller" capacitances depend, in general, on the value of the original feedback capacitance and the gain of the network plus one. In effect, a small base-collector capacitance may be equivalent to an input capacitance many times the original feedback capacitance value. For example, if the network's gain is 10, and the value of the base-collector capacitance is 7 pF, the resulting Miller capacitance, $C_\mu$, would typically be 77 pF (i.e., 7 pF* (1+10)). The capacitance-scaling produced by the Miller Effect typically has a large consequence on an amplifier's high frequency response. Therefore, as the gain of the amplifier is increased, Miller Effect generally lowers the amplifier's bandwidth.

Figure 1A:
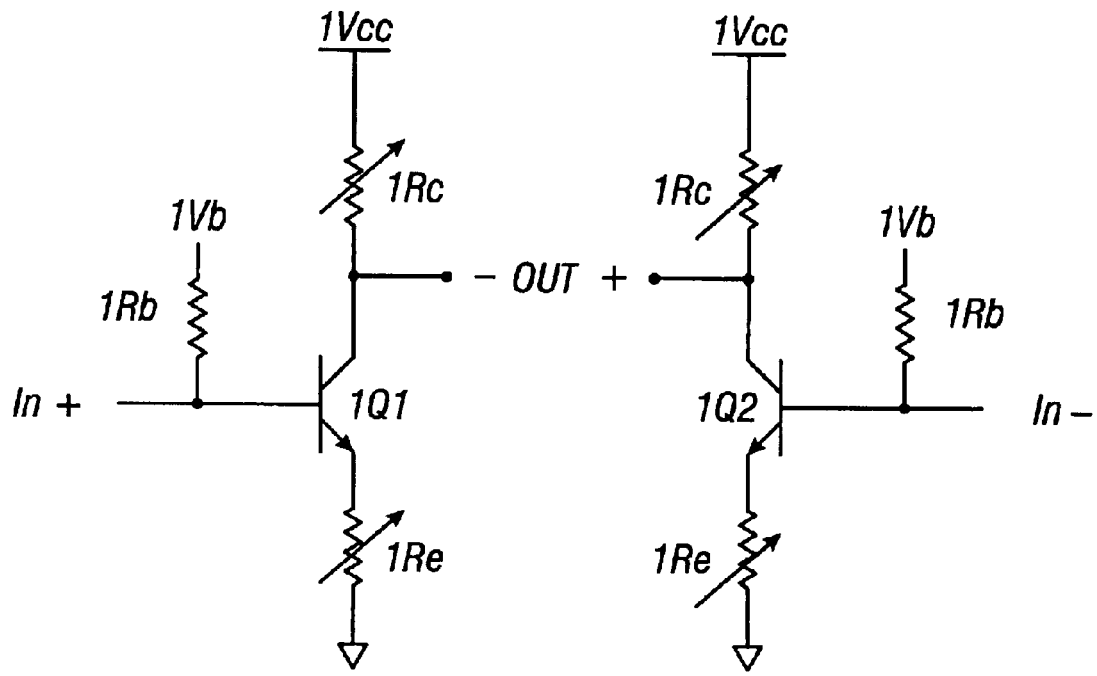
FIG. 1A is a block diagram showing a prior art single stage variable gain amplifier.
Figure 1B:
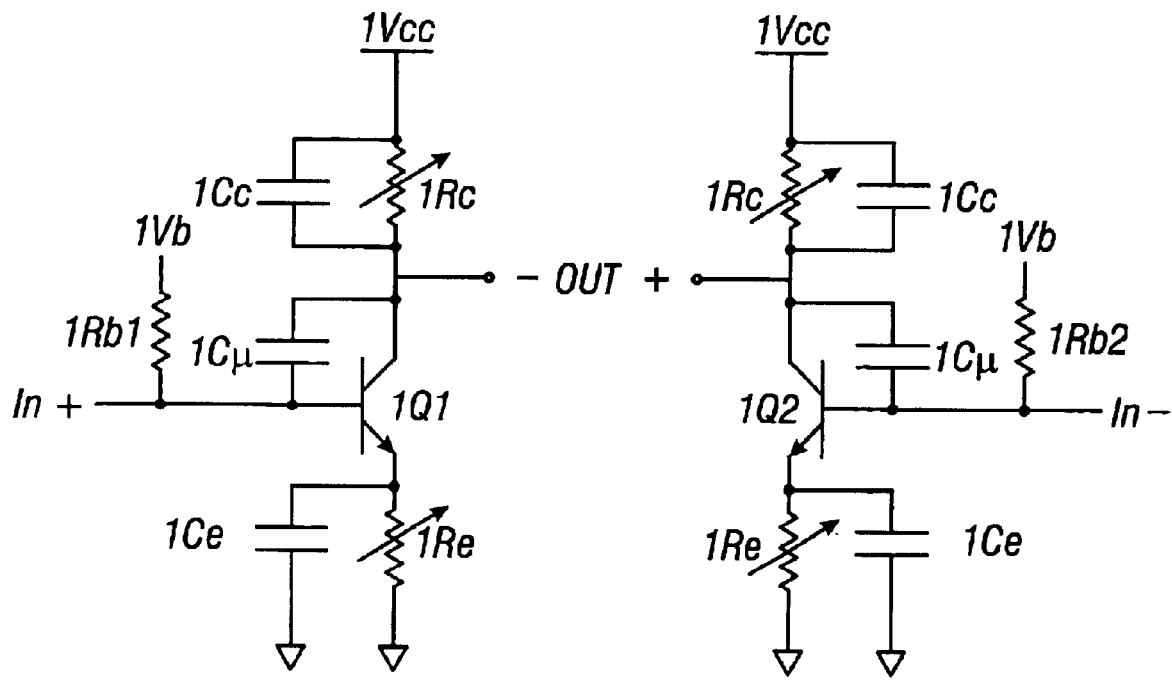
FIG. 1B is a block diagram figuratively showing the parasitic capacitances evident in a prior art single stage variable gain amplifier at high frequencies.
Figure 2:
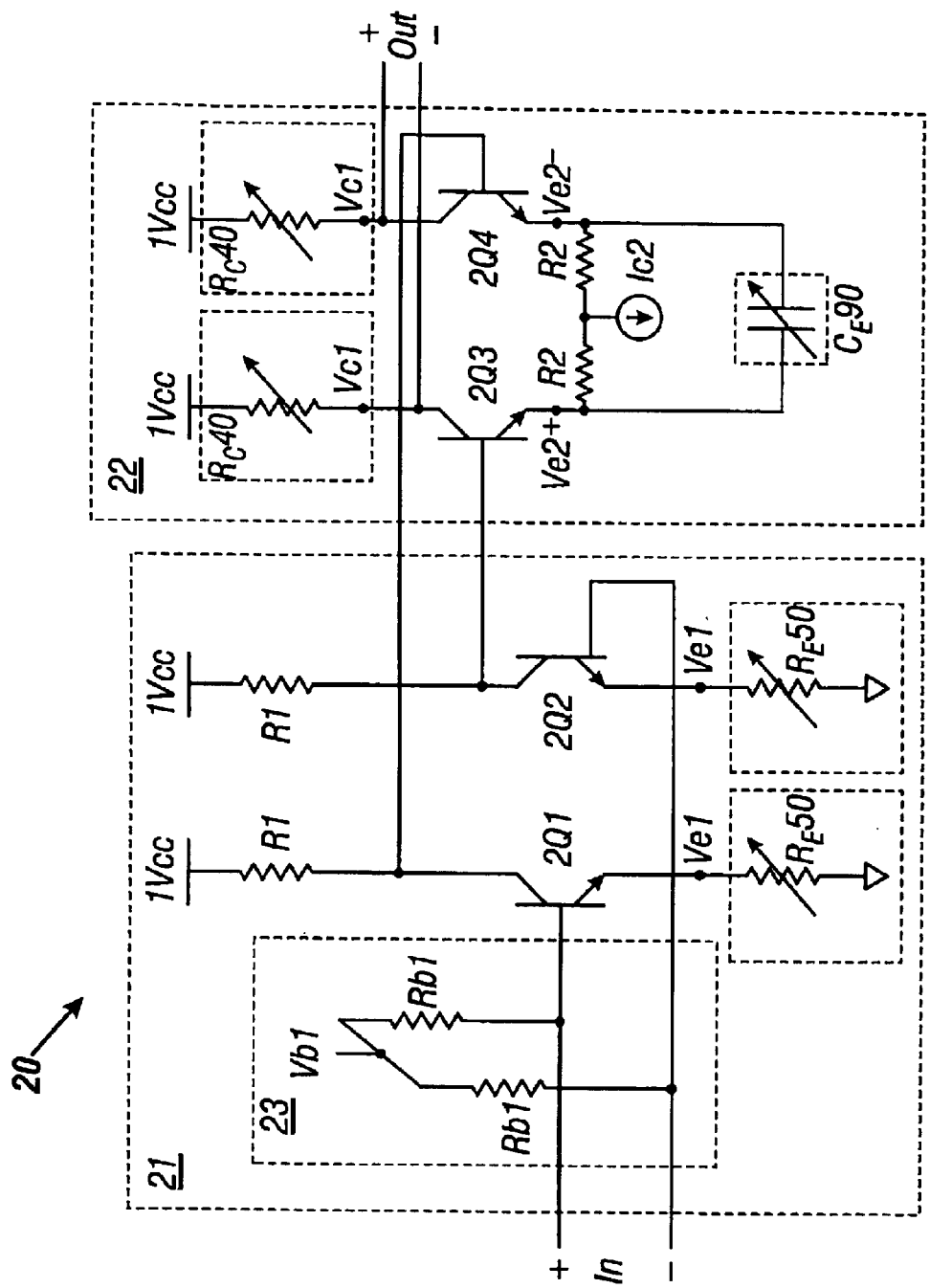
FIG. 2 shows a block diagram illustrating a preferred embodiment of the present invention.

FIG. 2 illustrates a preferred embodiment of the present invention which provides VLNA 20 in two amplification stages, 21 and 22, with a power supply 1 Vcc. For a given maximum gain, the two stages would preferably be configured such that stages one and two, 21 and 22, each share a percentage of the total maximum gain. The percentage may typically be determined by balancing the noise and linearity effects for each stage. In one preferred embodiment, stage one 21 may be configured to a maximum gain of 12 dB, while stage two 22 may be configured for a maximum of 8 dB. This combination yields a total amplifier gain of approximately 20 dB. However, it should be noted that the individual gain for each amplifier stage may be increased or decreased depending on the desired noise and linearity effects. Because the level of Miller Effect capacitance generally depends directly on the gain of the network, by reducing the gain of the amplification stage, the Miller Effect capacitance of the amplifier is preferably reduced. The overall capacitance of each stage is further reduced by preferably dividing the variable resistors between the two stages. Therefore, because each stage has preferably had its total capacitance reduced, the high frequency response of the entire VLNA should be increased.

Stages one and two, 21 and 22, are each preferably configured as differential transistor pairs. Stage one 21 preferably comprises transistors 2Q1 and 2Q2 with fixed collector resistors R1 and variable emitter resistor networks $R_E$ 50. Biasing circuit 23 may provide the necessary biasing conditions for stage one 21 with voltage source, Vb1, and biasing resistors, Rb1. The output of stage one 21 is preferably connected to the input terminals of stage two 22.

Stage two 22 preferably comprises transistors 2Q3 and 2Q4 with fixed emitter resistors R2, variable capacitor network $C_E$ 90, connected in parallel with R2, and variable collector resistor network $R_C$ 40. Constant pull-down current source, Ic2, is preferably connected between emitter resistors R2 and biases stage two 22 transistors, 2Q3 and 2Q4.

In operation, for a given bias current through transistors 2Q1 and 2Q2, increasing each $R_E$ 50 would generally decrease gain. By varying only $R_E$ 50, the amplifier's Third-order Output Intercept Point (OIP3), which is a chief measure of linearity, remains relatively constant, while the Third-order Input Intercept Point (IIP3) increases. With this variation of each $R_E$ 50, the noise figure of the device generally increases approximately one-half dB per dB of gain decrease.

In stage two 22, for a given bias current through transistors 2Q3 and 2Q4, decreasing each $R_C$ 40 also generally decreases gain. In contrast to the situation where only $R_E$ 50 is varied, when only $R_C$ 40 is varied, the OIP3 decreases, while the IIP3 remains relatively constant In this situation, the noise figure correspondingly increases a full dB per dB of gain decrease.

Figure 3:
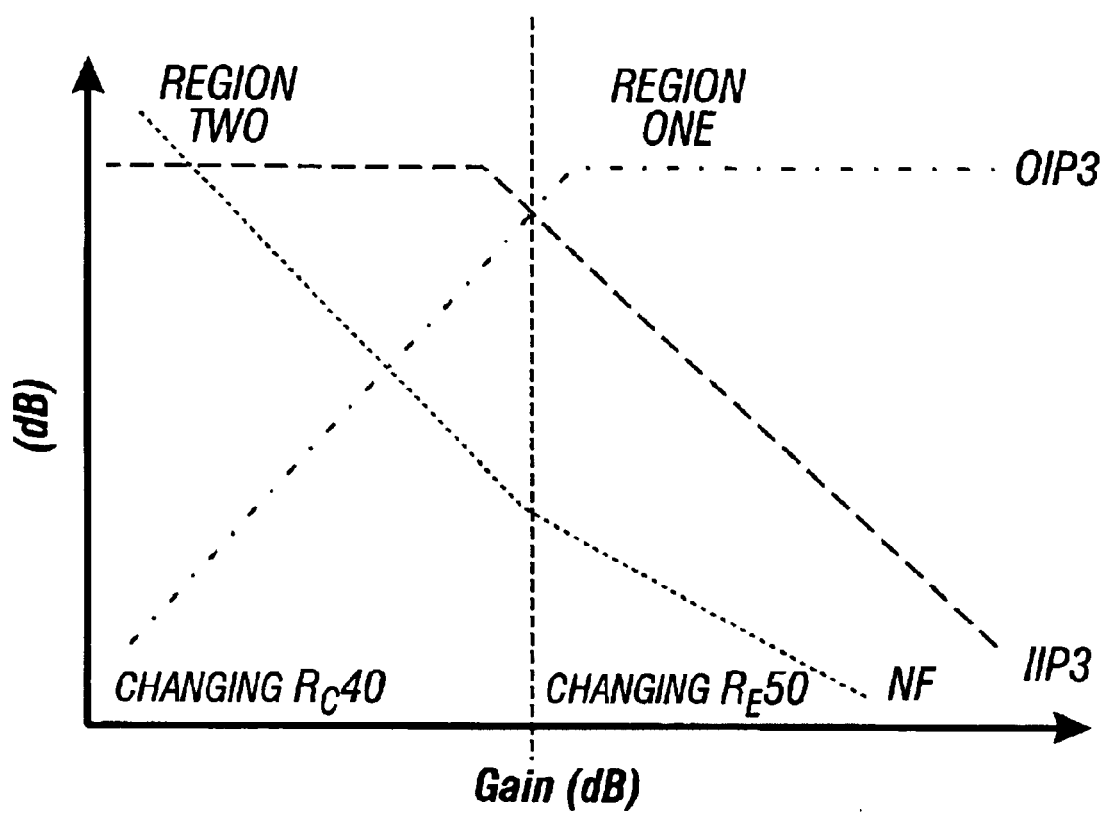
FIG. 3 is a graph showing the linearity versus the amplifier gain of a preferred embodiment of the present invention.

FIG. 3 shows the typical effects of varying only $R_E$ 50 and only $R_C$ 40 on the linearity and noise of the VLNA as measured by the OIP3, IIP3, and noise figure, NF. As the graph indicates, these behaviors result in distinctly different operating regions, depending on the gain selected. Region One behavior is exhibited generally with only $R_E$ 50 changing, while Region Two occurs generally with only $R_C$ 40 changing. As shown in FIG. 3, the OIP3 and IIP3 lines begin to deflect before touching one another. This shows that the two regions may not be contiguously defined.

The two regions shown in FIG. 3 define two different applications for a tuner system as a whole. When a VLNA is supplied by channels or signals from a cable system, a multitude of carriers exist at its input, each with a similar, low-power range. These closely aligned signals may create a large number of possible cross-modulated signal products, generally requiring very high output linearity, or OIP3, for the amplifier to operate within tolerance. Region One is, therefore, defined such that it generally encompasses the range of power supplied from different cable systems.

When broadcast signals or channels, received by an antenna, supply the VLNA, the amplifier typically encounters far fewer carriers, which are usually subject to precise governmental regulation of channel spacing and power. The regulated parameters help reduce the amount of channel-to-channel interference, thereby reducing the need for high output linearity. However, a single channel may contain much higher power than would be encountered in a cable signal due to broadcast station proximity, thereby requiring a much lower gain level. With a higher powered signal entering the VLNA, a higher input linearity, or IIP3, must be maintained to avoid input compression, but which may also degrade the noise figure. Region Two is, therefore, defined such that it encompasses the range of power expected from antenna applications.

The above observations concerning input and output intercept points show general trends that will only occur if $R_C$ 40 and $R_E$ 50 are varied linearly and remain nondistortive. If the resistors can be varied linearly, then the distortion due to the variable $g_m$ of the bipolar transistors, 2Q1 through 2Q4, will dominate. However, anything with a variable transconductance, i.e. $R_C$ 40 and $R_E$ 50, will typically operate as an active device and have non-linearities which must be controlled. While simple in concept, changing $R_C$ 40 and $R_E$ 50 in a linear and predictable manner is quite difficult. As will be discussed in more detail hereinafter, a preferred embodiment of the present invention uses a network of resistors and MOSFET devices to overcome this difficulty.

Figure 4:
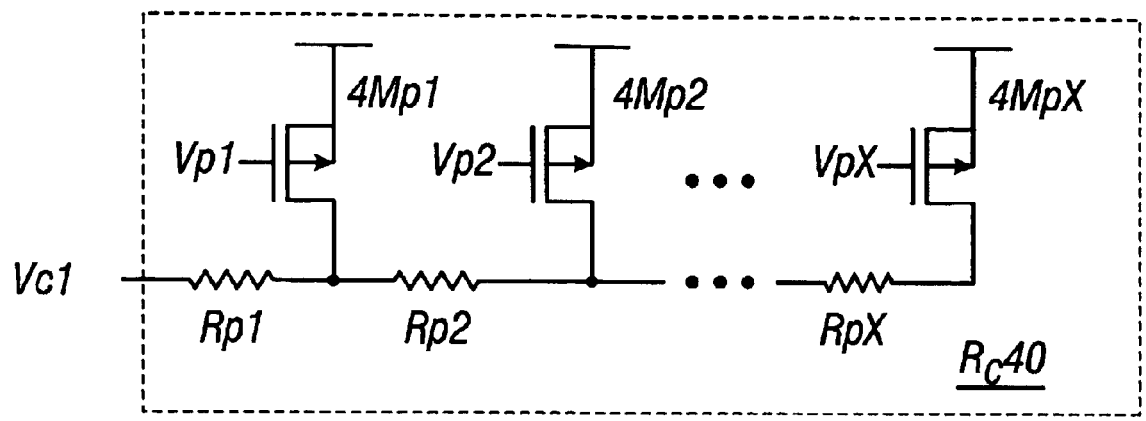
FIG. 4 shows a block diagram illustrating the configuration of the preferred variable collector resistor network of the inventive amplifier.
Figure 5:
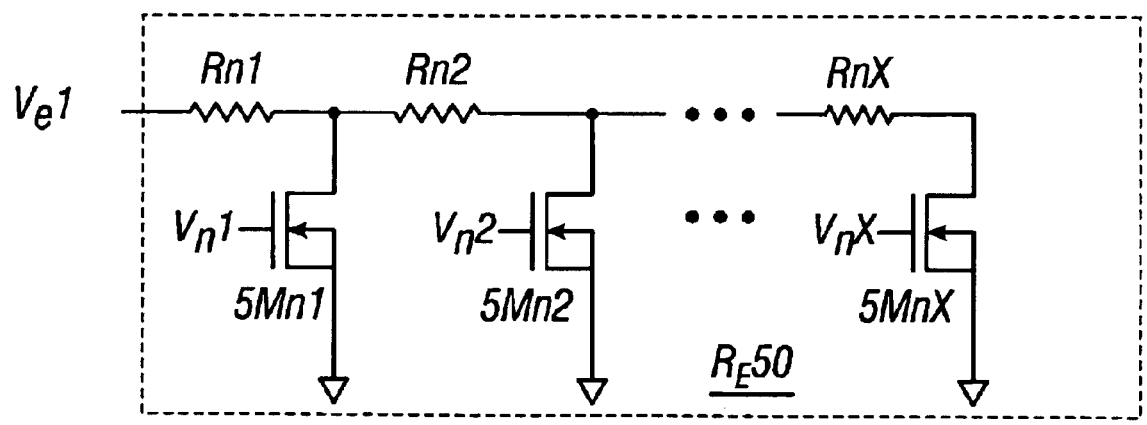
FIG. 5 shows a block diagram illustrating the configuration of the preferred variable emitter resistor network of the inventive amplifier.

Application Ser. No. 09/167,350, titled, HIGHLY LINEAR VARIABLE-GAIN LOW NOISE AMPLIFIER, filed on Oct. 7, 1998, and application Ser. No. 09/543,071, titled METHOD FOR A HIGHLY LINEAR VARIABLE-GAIN LOW NOISE AMPLIFIER, filed on Apr. 11, 2000, both disclose a configuration of the variable resistor networks as incorporated in the present invention. FIGS. 4 and 5 illustrate a preferred embodiment of resistor networks $R_C$ 40 and $R_E$ 50 using this configuration, which allow highly linear variation of resistance. The nodes "Ve1" and "Vc1" correspond to the respective points in FIG. 2. Control voltages Vp1 through Vpx, where 'x' can be any positive integer, change the effective resistance of resistor-related PMOS devices 4Mp1 through 4Mpx. By varying the gate voltage of resistor-associated MOSFET devices, the effective drain-to-source resistance may be predictably varied when operated in the triode region. Thus, control voltages Vn1 through Vnx, shown in FIG. 5, likewise control the effective resistance of resistor-related NMOS devices 5Mn1 through 5Mnx. All subsequent discussion will describe $R_E$ 50, which uses NMOS transistors. The operation of $R_C$ 40 (FIG. 4) may then be understood by reversing the description for the operation of control voltages Vp1 though Vpx (discussed with respect to FIGS. 6 and 7).

The number of MOSFET—Resistor pairs within either resistor network typically depends on the linearity requirements and the total gain range to be achieved. In a preferred embodiment, resistor network $R_C$ 40 may comprise four pairs, while resistor network $R_E$ 50 may comprise six pairs. However, it should be noted that with increased gain range required or increased linearity, these numbers may be increased or decreased depending on the specific requirement.

To set $R_E$ 50 to its minimum resistance, all of the supply voltage control lines are preferably set to the highest available voltage. Due to bias conditions on Ve1 and the choice of values of Rn1 through Rnx, all of the resistor-associated MOSFET devices should be in a triode region of operation. This gives a predictable drain-to-source resistance, which is generally inversely proportional to the gate voltage. Equation 2 provides a first-order approximation of the equivalent resistance, Rds, provided by an NMOS, where Vth is the threshold voltage of the device, and C is a constant depending on process and transistor geometry.

$$Rds = \frac{1}{C*(Vn - Vth)} \quad (2)$$

The resistance of $R_E$ 50 is preferably increased by changing the Vn control lines in a successive manner. First, Vn1 is gradually reduced, followed by Vn2 through Vnx. As the control voltage Vn is reduced, the effective resistance of the associated NMOS device increases. The overall resistance is also affected by resistors Rn1 through Rnx, which have several effects. By limiting the contribution of total resistance of the NMOS devices, it preferably reduces the sensitivity of resistor $R_E$ 50 to the control voltage, reduces the effect of the MOSFET's non-linearity, and helps confine the transistors to the triode mode of operation.

Figure 6:
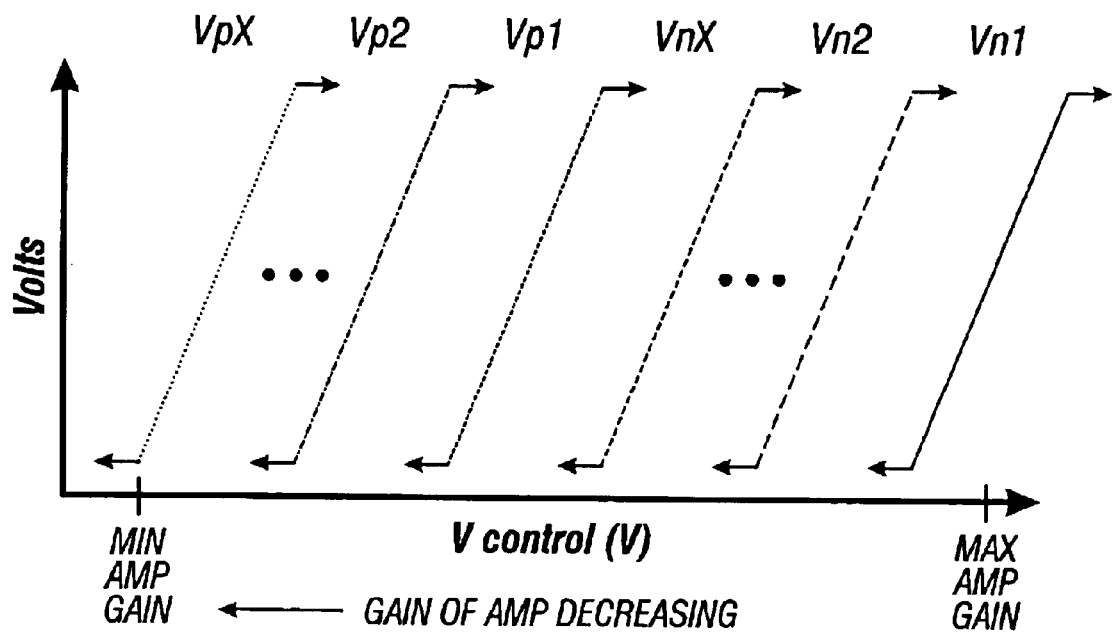
FIG. 6 shows a graph of control voltage versus differential control voltage input (gain control)
Figure 7:
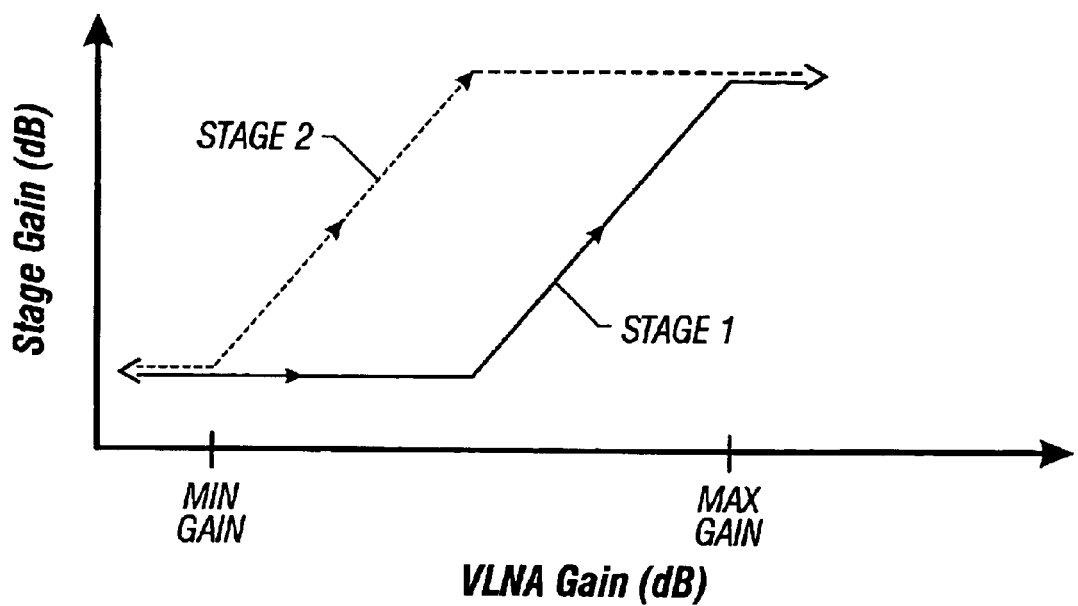
FIG. 7 shows a graph of the individual stage gain versus total amplifier gain.

FIG. 6 graphically illustrates the order and method of changing the Vn and Vp control lines in a successive manner so as to increase or decrease the total gain of the VLNA. When reducing the amplifier's gain from its maximum point, Vn1 is first gradually reduced, followed by Vn2, through Vnx, which continually increases $R_E$ 50's effective resistance, as indicated above. $R_C$ 40's effective resistance is decreased after $R_E$ 50 reaches its effective maximum by subsequently reducing the Vp control lines. Following this preferred method of the present invention, the VLNA may traverse from maximum gain to minimum gain while maintaining a constant OIP3 for cable channel signals within the higher gain, region one of FIG. 3, and maintaining a constant IIP3 for broadcast/antenna channel signals within the lower gain, region two of FIG. 3. FIG. 7 shows a graph of the individual stages gains versus the overall gain of VLNA 20. The two regions of operation may be observed from the graph as the point at which the gain of either stage either begins or stops changing.

Figure 8:
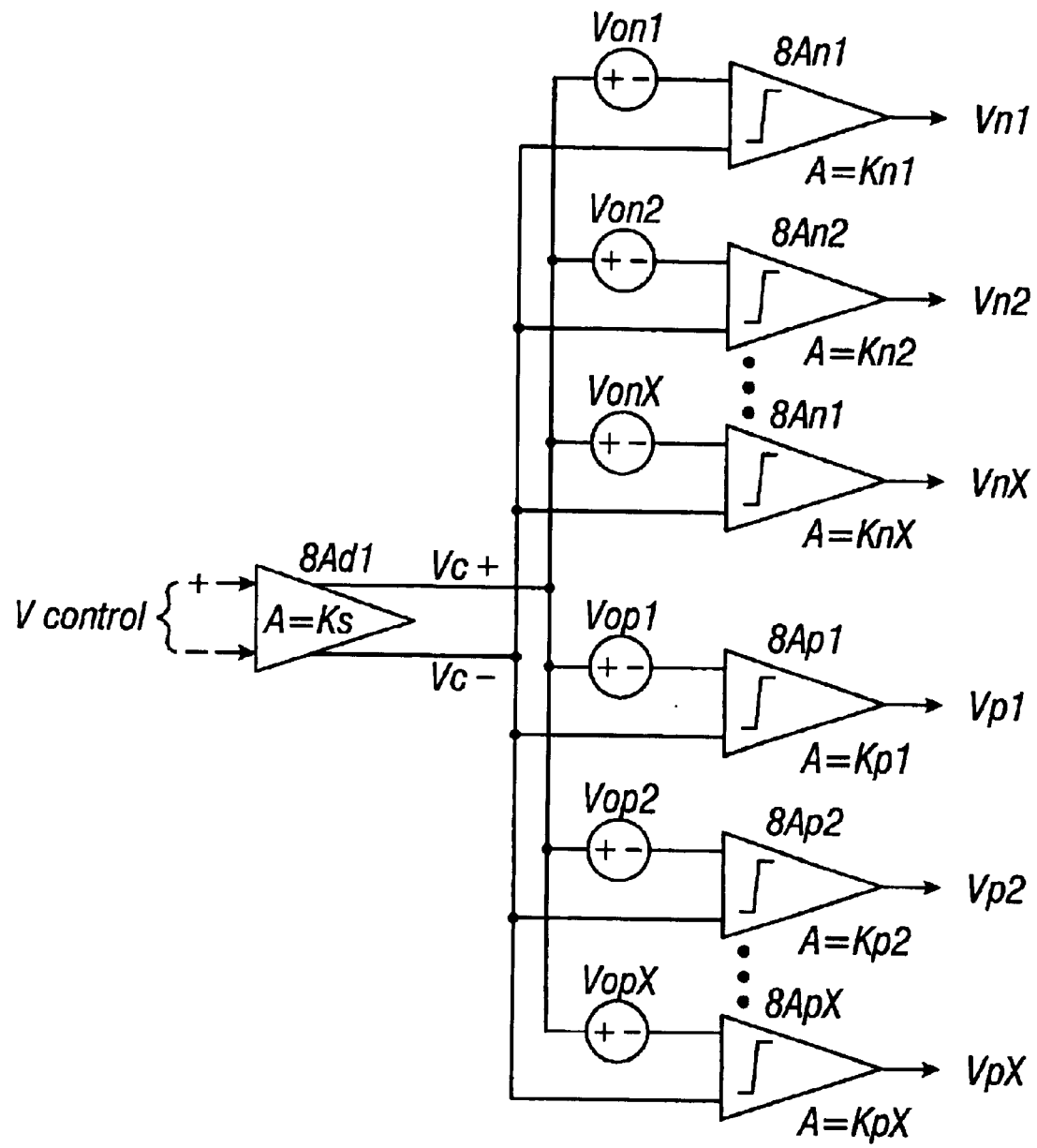
FIG. 8 shows a block diagram of the circuitry to accomplish the voltages shown in FIG. 6.

FIG. 8 shows a simplified block diagram of the control circuitry for the control voltages shown in FIG. 6 of a preferred embodiment of the present invention. As indicated, the control signal is preferably applied to a fully differential amplifier 8Ad1 with gain Ks, which produces complementary signals Vc±. Amplifier 8Ad1 preferably sets the sensitivity of the VLNA's gain to the applied differential control voltage, Vcontrol. A larger gain, Ks, makes the VLNA's gain more sensitive with respect to Vcontrol.

Control voltage, Vc, is then preferably distributed to separate amplifiers, 8An1 through 8Apx, each directing one of the control lines, Vn1 through Vnx or Vp1 through Vpx, contained within the VLNA amplifier core. Each amplifier also preferably has an individual input offset voltage, Von1 through Vopx represented by a discrete voltage source at its input. The offset voltages are preferably increased successively, starting with amplifier 8An1 and offset voltage Von1, and ending with amplifier 8Apx with offset Vopx. The gradually increasing offset voltages preferably set the point where each control line will begin to change, or "break."

Also note that each amplifier, 8An1 through 8Apx, preferably has an individual gain, Kn1 through Knx or Kp1 through Kpx, which generally sets the slope of the corresponding control line Vn or Vp during its transition. The amplifiers preferably have a high output swing (from ground to 1 Vcc) to properly drive the MOSFET gates they control.

Figure 9:
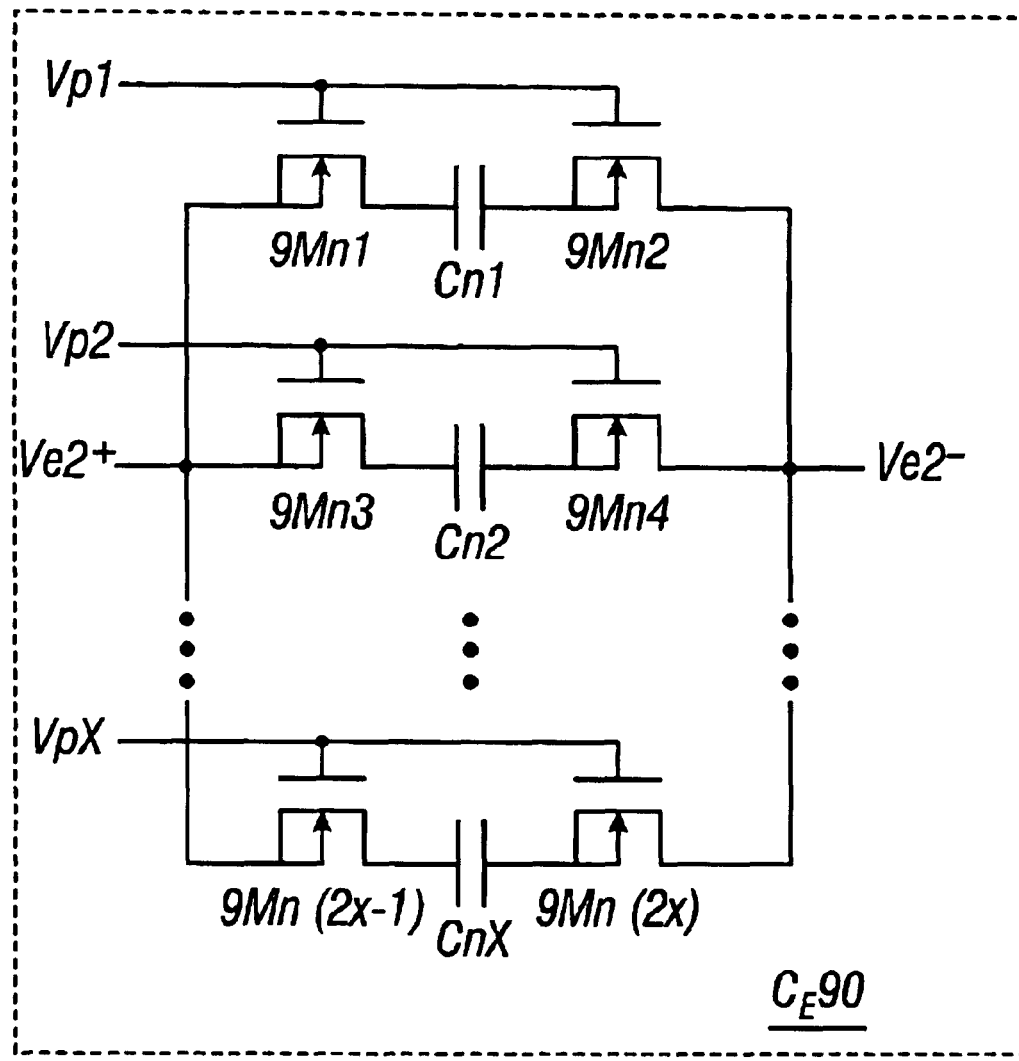
FIG. 9 shows a block diagram illustrating the preferred configuration of the variable capacitor network of the inventive amplifier.

Variable capacitor network $C_E$ 90 of stage two performs similarly to the disclosed variable resistors. FIG. 9 illustrates the preferred embodiment of variable capacitor network $C_E$ 90. This variable capacitor is preferably formed from individual fixed capacitor units by changing the number of units in parallel in a piece-wise linear fashion. A unit is formed from two capacitor-associated NMOS transistors and a single capacitor in a series combination, such as shown with 9Mn1, 9Mn2, and Cn1. Thus, the total impedance, $Z_{CE}$, of capacitor network $C_E$ 90 is preferably the parallel combination of each of the individual unit's impedances. The individual capacitor unit's approximate series impedance $Z_{CEX}$ is given by equation 3, where Rds is the impedance of a capacitor-related NMOS device as given by equation 2, and $Z_{CN}$ is the impedance of the capacitor. Voltages at nodes Ve2+ and Ve2− are chosen such that, when activated, the NMOS transistors are in a triode region of operation.

$$Z_{CEX} = 2 * Rds + Z_{CN} \quad (3)$$

The control voltages Vn1 through Vnx, which also control the variable resistor network $R_E$ 50, preferably change the effective resistances of NMOS devices 9Mn1 through 9Mn (2x). To control the variation of the capacitance in a linear and predictable manner, each capacitor unit is preferably successively activated, varied, or deactivated. For example, when each MOSFET of $C_E$ 90 is off, no current flows through the capacitor network and, therefore, no capacitance would be added to the circuit. As Vn1 is increased above the threshold, Vth, the resistance, Rds, in MOSFETs 9Mn1 and 9Mn2 begins to decrease. The unit impedance, $Z_{CEX}$ for this particular capacitor unit will then be dominated by the Rds term, and the overall series impedance will be very large. As Vn1 continues to increase towards its maximum value, the Rds term of equation 3 will decrease, and the unit's series impedance will become dominated by the impedance $Z_{CN}$ of capacitor Cn1. At this point, the capacitance of Cn1 will have been fully added to the circuit path. To further increase the capacitance, Vn2 is preferably increased, which, in turn, adds a gradually increasing percentage of the capacitance of Cn2 to the circuit path of amplification stage 2. This successive process preferably continues until each MOSFET in $C_E$ 90 is in its minimum resistance state, thus adding the total capacitance of Cn1 through Crix to the circuit path.

Similar to the resistor networks, the number of capacitor units depends on the gain range desired and the linearity required. In one preferred embodiment, there may be three sets of capacitor units. However, it should be noted that a greater or fewer number of units may be added to the circuit to provide a certain gain range or linearity response. Because the variable capacitor, $C_E$ 90, has a boosting or peaking effect on the amplifier's high frequency response, the requisite level of high frequency response may also contribute to determining the number of capacitor units to include.

According to this configuration of a preferred embodiment of the present invention, capacitance is only added in parallel to R2 in stage two 22 during higher gain applications of stage one 21. As previously indicated, $R_E$ 50 and $C_E$ 90 are both varied by control voltages Vn1 through Vnx. As the control voltages increase, the resistance of $R_E$ 50 preferably decreases, which corresponds to higher gain in stage one 21. Due to the aforementioned Miller Effect, this increase in gain typically causes the bandwidth of stage one 21 to decrease. Thus, the variable capacitor $C_E$ 90 is controlled such that as the bandwidth of stage one 21 decreases with an increase in control voltage, the gain peaking of stage two 22 preferably increases to compensate for the Miller Effect. This generally allows a preferred constant bandwidth of VLNA 20 over its entire gain range.

Referring again to FIG. 2, unlike stage one 21, which exhibits a gain proportional to $R1/R_E$ 50, stage two 22 exhibits a gain proportional to $R_C$ 40/(R2||$Z_{CE}$), where $Z_{CE}$ is the total impedance of variable capacitor network $C_E$ 90. If the total impedance of $C_E$ 90 is low, the resulting gain will be peaked or higher at the high frequencies because a capacitor has a lower impedance at higher frequencies.

Figure 10:
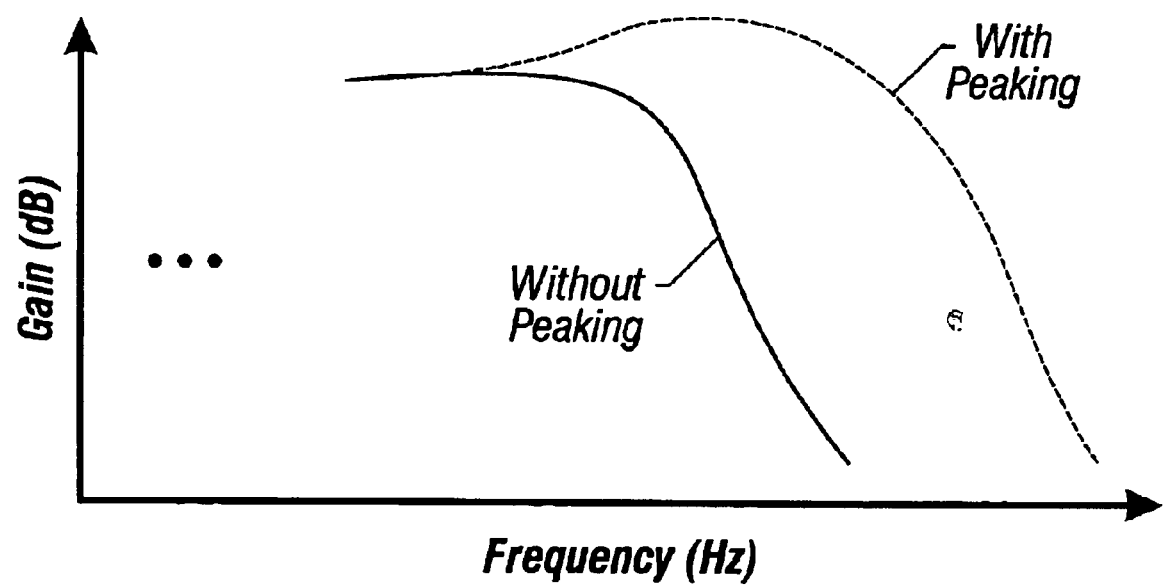
FIG. 10 is a graph showing the high frequency response of the inventive amplifier.

FIG. 10 shows a frequency spectrum plot of VLNA 20's high frequency response both with and without the gain peaking due to $C_E$ 90. With $C_E$ 90 in the circuit path, the peak at the high frequencies effectively increases the amplifier's maximum gain and high corner frequency. This is due to the lowered emitter impedance preferably caused by the addition of $C_E$ 90. The gain increase also correspondingly widens the bandwidth of VLNA 20 through the peaking. Therefore, by adding $C_E$ 90, both the gain and bandwidth of VLNA 20 are increased at high frequencies for the maximum gain applications.

It should be noted that in addition to the improved high frequency response of the invention, the variable capacitance would generally allow a preferred embodiment to perform a degree of signal filtering. In a tuner application, a VLNA is typically located on the front end. As referenced earlier, a tuner's performance will typically be enhanced by reducing the number of channel frequencies to the input of the tuner. Instead of the costly addition of discrete LC filters, which generally may not be fabricated on a single integrated circuit substrate, a preferred embodiment of the present invention may be used not only as a VLNA, but also used to filter the input frequency range (approximately 50 MHZ to 850 MHZ) down to a more manageable bandwidth. While the current state of the art in integrated circuit filtering generally has not advanced to allow single-channel filtering (i.e., filtering to a 6 MHZ bandwidth), as may be possible with a discrete LC filter, the lower cost and space requirements of an integrated, filtering VLNA, which preferably enhances tuner performance, creates an advantageous and desirable combination.

Figure 11:
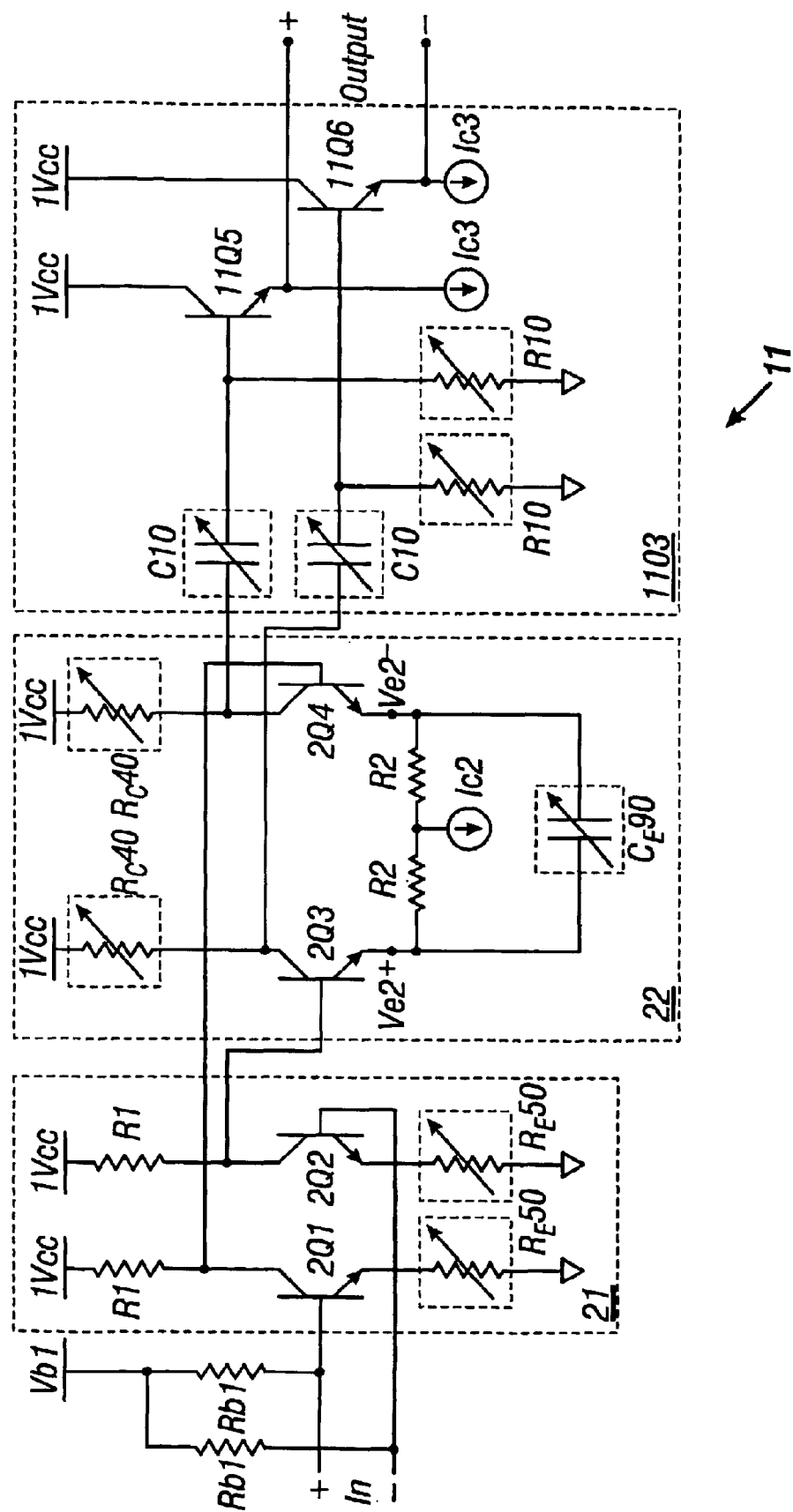
FIG. 11 shows a block diagram of an alternative embodiment of the present invention.

FIG. 11 shows an alternative embodiment of the present invention, which expands on the filtering attributes of the inventive VLNA, comprising a three-stage amplifier. Stages one and two, 21 and 22, perform similarly to the two-stage embodiment described above. Stage three 1103, configured as a common-collector buffer stage, preferably adds a set of variable capacitor networks, C10, in series with the second stage output. Variable shunt resistor networks, R10, are added to create a variable-frequency high-pass filter. This buffer stage, comprising transistors, 11Q5 and 11Q6, preferably operates as a power amplifier with negative overall voltage gain. The high power output and low output impedance of the common-collector configuration is beneficial to drive a subsequent block of the system. C10 and R10 are both preferably configured as variable networks similar to the variable resistor and capacitor networks shown in FIGS. 4, 5, and 9.

Stage three 1103's high-pass frequency, $f_{HP}$, is given by equation 5. Due to the variability of C10 and R10, $f_{HP}$, may preferably be varied to change the bandwidth of the buffer, and thus the VLNA as a whole.

$$f_{HP} = \frac{1}{2\pi * C10 * R10} \quad (5)$$

The variable low-pass filter created by the use of $C_E$ 90 in stage two 22, and the variable high-pass filter created by stage three 1103, gives a VLNA that can significantly reduce the number of unwanted frequencies or channels transmitted to the rest of the tuner. For instance, if the desired channel were located at 50 MHZ, the low-pass frequency of stage two 22 would be set at a minimum by disabling the capacitors of $C_E$ 90. The high-pass frequency of stage three 1103 would be set at its minimum by maximizing the values of C10 and R10. This would filter out the high-frequency channels while passing the desired frequency of 50 MHZ.

Alternatively, if the desired channel were located at 850 MHZ, the low-pass frequency of stage two 22 would be set at its maximum by activating all of the NMOS transistors of $C_E$ 90. The high-pass frequency would be set at its maximum by minimizing the values of C10 and R10. This configuration would pass the desired frequency while filtering lower channels.

The preferred embodiment of the present invention, shown in the figures and disclosed as a fully differential amplifier configurations, exhibits the beneficial characteristics of power supply and substrate injection rejection. Unwanted spurious signals, typically resulting from the injection of carriers from the fabricated devices into the integrated circuit substrate, are generally canceled out in fully differential configurations. This beneficial trait preferably allows the construction of the present invention onto a single integrated circuit substrate with other application components, such as a tuner or receiver. Because of injection rejection, an amplifier of the present invention would preferably not interfere with the integrated tuner or receiver. However, it should be noted that a non-differential embodiment of the present invention is equally feasible.

Figure 12:
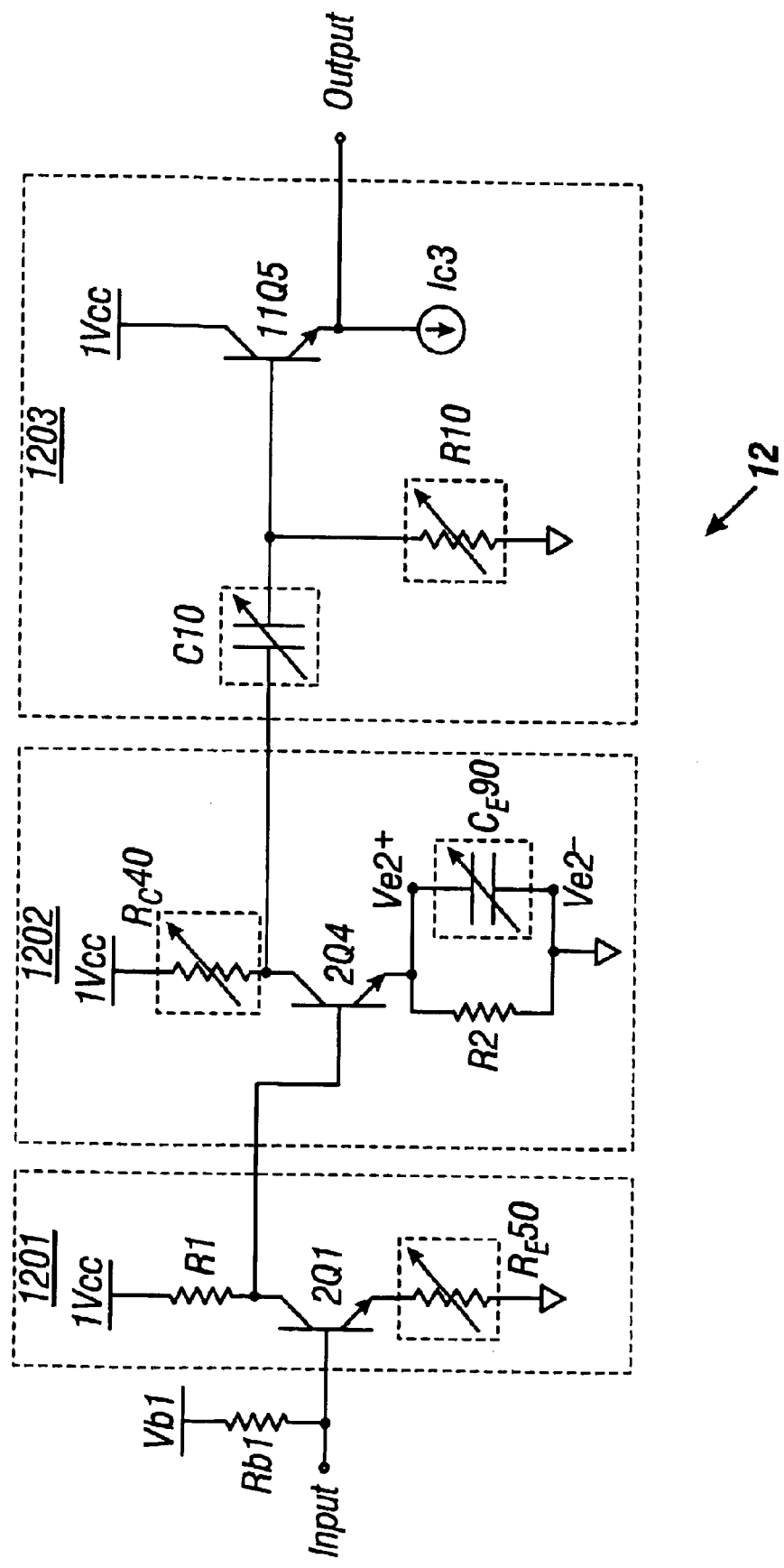
FIG. 12 shows a block diagram illustrating a nondifferential embodiment of the present invention.

FIG. 12 shows a block diagram of a non-differential configuration of the present invention. Without the added components, VLNA 12 would preferably be less noisy than the differential amplifier shown in FIGS. 2 and 11. It would also preferably require only half of the power of the fully differential amplifiers. In the non-differential configuration, stage one 1201, stage two 1202, and stage three 1203 begin with the core transistors 2Q1, 2Q4, and 11Q5. Vcc supplies the necessary power for each stage's transistor with biasing from Vb1 and Rb1 for stage one 1201, and Ic3 for stage three 1203. Each of the other components is similarly configured to the differential amplifier. Stage one 1201 gain is controlled by R1 and variable resistor network $R_E$ 50. Stage two 1202 gain is controlled by variable resistor network $R_C$ 40 and the parallel combination of the impedances of R2 and variable capacitor network $C_E$ 90. Stage three 1203 assists in determining the high-pass frequency corner of the amplifier through variable networks, C10 and R10. Therefore, the control of VLNA 12, with emphasis on-maintaining the OIP3 and IIP3 for each region of interest, arises using the same principles from the differential configuration.

Even though the present invention may be configured as a non-differential amplifier, the limitations of the non-differential configuration would typically prevent integrating it with other components onto the same integrated circuit substrate. However, as constructed with discrete components, the non-differential configuration of the present environment preferably exhibits the same OIP3 and IIP3 characteristics.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A variable gain amplifier comprising:
   a first amplification stage; and
   a second amplification stage in communication with said first amplification stage, wherein said first amplification stage and said second amplification stage are adapted to cooperate such that a first mode of operation provides gain adjustment of an input signal while substantially maintaining output linearity and a second mode of operation provides gain adjustment of said input signal while substantially maintaining input linearity and wherein a high frequency response of said amplifier is maintained by selectively varying an adjustable capacitor disposed on said second amplification stage.

2. The amplifier of claim 1 wherein a gain of said amplifier comprises a combination of a first stage gain and a second stage gain:
   wherein said first amplification stage comprises a first transistor network, wherein said first stage gain is varied by varying resistance in a circuit path of said first transistor network; and
   wherein said second amplification stage comprises a second transistor network, wherein said second stage gain is varied by varying resistance in a circuit path of said second transistor network.

3. The amplifier of claim 2 wherein said first and second transistor networks comprise differential pairs of transistors.

4. A variable gain amplifier comprising:
   a first amplification stage, and a second amplification stage in communication with said first amplification stage, wherein a high frequency response of said amplifier is maintained by selectively varying an adjustable capacitor disposed on said second amplification stage, and wherein a gain of said amplifier comprises a combination of a first stage gain and a second stage gain;
   wherein said first amplification stage comprises a first transistor network comprising differential pairs of transistors, wherein said first stage gain is varied by varying resistance in a circuit path of said first transistor network;
   wherein said second amplification stage comprises a second transistor network comprising differential pairs of transistors, wherein said second stare gain is varied by varying resistance in a circuit path of said second transistor network; and
   wherein said adjustable capacitor is adjusted responsive to varying said gain of said amplifier.

5. The amplifier of claim 2 constructed substantially on a single integrated circuit substrate.

6. The amplifier of claim 3 constructed substantially on a single integrated circuit substrate.

7. A method for maintaining a high frequency response of a variable gain amplifier comprising the steps of:
   selectively varying a gain of said amplifier; and
   adjusting a variable capacitor responsive to said selectively varying said gain step, wherein said high frequency response of said amplifier remains substantially constant.

8. The method of claim 7 wherein said amplifier comprises a multistage amplifier having at least a first and a second amplification stage, wherein said selectively varying said gain step comprises the steps of:
   selectively varying a gain of said first amplification stage; and
   selectively varying a gain of said second amplification stage.

9. The method of claim 8, wherein said variable capacitor is disposed on said second amplification stage.

10. The method of claim 7 performed substantially on single integrated circuit substrate.

11. The method of claim 9 performed substantially on a single integrated circuit substrate.

12. A variable gain amplifier comprising:
    a first amplification stage; and
    a second amplification stage in communication with said first amplification stage, wherein said first amplification stage and said second amplification stage are adapted to cooperate such that a first mode of operation provides gain adjustment of an input signal while substantially maintaining a Third-Order Output Intercept Point (OIP3) and a second mode of operation provides gain adjustment of said input signal while substantially maintaining a Third-Order Input Intercept Point (IIP3).

13. The amplifier of claim 12 wherein said amplifier is adapted to receive a first class of inputs needing a substantially constant OIP3 and a second class of inputs needing a substantially constant IIP3.

14. The amplifier of claim 13 wherein said first class of inputs comprise cable frequency channels and said second class of inputs comprise broadcast frequency channels.

15. The amplifier of claim 13 further comprising:
    a variable first stage gain; and
    a variable second stage gain, wherein adjusting said variable first stage gain while maintaining said variable second stage gain results in substantially maintaining said OIP3, and wherein adjusting said variable second stage gain while maintaining said variable first stage gain results in substantially maintaining said IIP3, and wherein said adjusting said variable first stage gain substantially maintains a high frequency response of said amplifier.

16. The amplifier of claim 15:
    wherein said first amplification stage comprises a first amplifier, wherein said variable first stage gain is controlled by a first stage resistor and a first stage variable resistor network; and
    wherein said second amplification stage comprises a second amplifier, wherein said variable second stage gain is controlled by a second stage resistor, a second stage variable resistor network, and a second stage variable capacitor network.

17. The amplifier of claim 16 wherein said first and second stage variable resistor networks each comprise a plurality of resistors in communication with a plurality of resistor associated transistors, wherein resistance of said first or second amplification stage is controlled by selectively and sequentially varying the effective resistance of said resistor associated transistors.

18. The amplifier of claim 17 wherein said second stage variable capacitor network comprises a plurality of capacitors in communication with a plurality of capacitor associated transistors, wherein impedance of said second amplification stage is controlled by selectively and sequentially varying the effective resistance of said capacitor associated transistors.

19. The amplifier of claim 18 wherein said effective resistance of said transistors is varied by adjusting the biasing of said transistors.

20. The amplifier of claim 18 wherein varying said variable first stage resistor network varies said variable second stage capacitor network such that capacitance increases as resistance decreases and capacitance decreases as resistance increases.

21. The amplifier of claim 20 wherein said decrease of resistance in said variable first stage resistor network reduces a bandwidth of said first stage.

22. The amplifier of claim 21 wherein said increase of capacitance of said variable second stage capacitor network responsive to said decrease in resistance of said variable first stage resistor network increases a bandwidth of said amplifier.

23. The amplifier of claim 12 constructed substantially on a single integrated circuit substrate.

24. The amplifier of claim 18 constructed substantially on a single integrated circuit substrate.

25. A method for providing variable gain amplification comprising the steps of:
   selecting an operating mode of a plurality of operating modes of an amplifier based at least in part on an input signal characteristic, wherein said selected operating mode of said amplifier maintains a particular Third-Order Intercept Point (IP3); and
   varying a gain of said amplifier based at least in part on said selected operating mode.

26. The method of claim 25, wherein said amplifier comprises a plurality of amplification stages, each of said amplification stages having a variable gain contribution to a total gain of said amplifier, and wherein said varying said gain step comprises the steps of:
   selecting a particular amplification stage for manipulation based at least in part on said selected operating mode; and
   varying a gain of said selected amplification stage.

27. The method of claim 26 wherein said input signal characteristic suggests maintaining a substantially constant output IP3 (OIP3) when said input signal is amplified.

28. The method of claim 27 wherein said selected amplification stage is a first stage, wherein said selected operating mode is a first operating mode, and wherein said varying said gain of said selected amplification stage step is controlled by a first stage variable resistor network.

29. The method of claim 28 wherein said first stage variable resistor network comprises a plurality of resistors in communication with a plurality of resistor related transistors, said method further including the step of:
   varying biasing conditions of said plurality of resistor related transistors selectively and sequentially, for controlling an effective resistance of said resistor related transistors.

30. The method of claim 29 wherein a high frequency response of said amplifier is maintained by a second stage variable capacitor network variable in response to said varying said biasing conditions of said plurality of resistor related transistors.

31. The method of claim 30 wherein said second stage variable capacitor network comprises a plurality of capacitors in communication with a plurality of capacitor associated transistors, wherein biasing conditions of said capacitor associated transistors are responsively controlled by said biasing conditions of said plurality of resistor related transistors.

32. The method of claim 26 wherein said input signal characteristic suggests maintaining a substantially constant input IP3 (IIP3) when said input signal is amplified.

33. The method of claim 32 wherein said selected amplification stage is a second stage, wherein said selected operating mode is a second operating mode, and wherein said varying said gain of said selected amplification stage step is controlled by a second stage variable resistor network.

34. The method of claim 33 wherein said second stage variable resistor network comprises a plurality of resistors in communication with a plurality of resistor associated transistors, said method further including the step of:
   varying biasing conditions of said plurality of resistor associated transistors selectively and sequentially for controlling an effective resistance of each of said resistor associated transistors.

35. A variable gain amplifier comprising:
   a first stage comprising:
   a first stage transistor;
   a load resistor connected to said first stage transistor; and
   a adjustable first stage resistor connected to said first stage transistor; and
   a second stage comprising:
   a second stage transistor, wherein an input to said second stage transistor is connected to an output of said first transistor;
   an adjustable load resistor connected to said second stage transistor;
   a second stage resistor connected to said second stage transistor; and
   an adjustable capacitor connected in parallel with said second stage resistor for controlling a high frequency response of said amplifier;
   wherein a current flow through said first stage and second stage transistors is adjusted to vary the gain of said amplifier, while selectively maintaining a Third-Order Intercept Point (IP3) at a constant level.

36. The invention of claim 35:
   wherein said first stage further comprises:
   a second transistor, wherein said first stage transistor and said second transistor form a first pair of transistors;
   a second load resistor, wherein said load resistor and said second load resistor form a pair of load resistors connected to said first pair of transistors; and
   a second adjustable first stage resistor, wherein said adjustable first stage resistor and said second adjustable first stage resistor form a pair of adjustable first stage resistors connected to a common terminal of said first pair of transistors; and
   wherein said second stage further comprises:
   a second transistor, wherein said second stage transistor and said second transistor form a second pair of transistors, wherein an input of said second transistor is connected to an output of said second transistor of said first stage;
   a second adjustable load capacitor, wherein said adjustable load capacitor and said second adjustable load capacitor form a pair of adjustable load capacitors connected to said second pair of transistors; and
   a second resistor, wherein said second stage resistor and said second resistor form a pair of second stage resistors connected to a common terminal of said second pair of transistors, wherein said adjustable capacitor is connected in parallel with said pair of second stage resistors.

37. The invention of claim 36 wherein said current flow is adjusted by selectively varying said adjustable resistors of said first stage, said adjustable load resistors of said second stage, and said adjustable capacitor of said second stage.

38. The invention of claim 37 wherein said adjustable resistors of said first stage and said adjustable load resistors of said second stage each comprise a network having a plurality of resistors connected to a plurality of resistor associated transistors, wherein a resistance of a circuit path of said amplifier is controlled by selectively and sequentially varying biasing conditions for said resistor associated transistors to control an effective resistance of said resistor associated transistors.

39. The invention of claim 38 wherein said adjustable capacitor of said second stage comprises a network having a plurality of capacitors connected to a plurality of capacitor associated transistors, wherein a capacitance of a circuit path of said amplifier is controlled by selectively and sequentially varying biasing conditions for said capacitor associated transistors to control an effective resistance of said capacitor associated transistors, wherein said capacitance is added in proportion to a current allowed by said effective resistance of said capacitor associated transistors.

40. The invention of claim 39 wherein input signals require selectively maintaining an Input IP3 (IIP3) constant.

41. The invention of claim 40 wherein said input signals comprise broadcast frequency signals which require a high input linearity.

42. The invention of claim 39 wherein input signals require selectively maintaining an Output IP3 (OIP3) constant.

43. The invention of claim 42 wherein said input signals comprise cable frequency signals which require a high output linearity.

44. The invention of claim 40 wherein said first and second pairs of transistors are bipolar transistors and wherein said IIP3 is held constant by maintaining a pair of adjustable emitter resistors of said first stage constant while selectively and sequentially varying a pair of adjustable collector resistors of said second stage.

45. The invention of claim 40 wherein said first and second pairs of transistors are field effect transistors (FET) and wherein said IIP3 is held constant by maintaining a pair of adjustable source resistors of said first stage constant while selectively and sequentially varying a pair of adjustable drain resistors of said second stage.

46. The invention of claim 42 wherein said first and second pairs of transistors are bipolar transistors and wherein said OIP3 is held constant by maintaining a pair of adjustable collector resistors of said second stage constant while selectively and sequentially varying a pair of adjustable emitter resistors of said first stage.

47. The invention of claim 42 wherein said first and second pairs of transistors are FETs and wherein said OIP3 is held constant by maintaining a pair of adjustable drain resistors of said second stage constant while selectively and sequentially varying a pair of adjustable source resistors of said first stage.

48. The invention of claim 39 wherein said adjustable capacitor and said adjustable first stage resistors are controlled by identical biasing conditions configured to simultaneously increase capacitance as first stage resistance decreases and to simultaneously decrease capacitance as first stage resistance increases.

49. The invention of claim 35 further comprising:
a third stage comprising:
a third transistor, wherein an input of said third transistor is connected to an output of said second transistors;
a variable capacitor connected between said output of said second stage and said input of said third stage; and
a variable resistor connected between said output of said second stage and said input of said third stage.

50. The invention of claim 49:
wherein said third stage further comprises:
a second transistor, wherein said third transistor and said second transistor form a third pair of transistors;
a second variable capacitor, wherein said variable capacitor and said second variable capacitor form a pair of variable capacitors connected between said outputs of said second stage and inputs of said third stage; and
a second variable resistor, wherein said variable resistor and said second variable resistor form a pair of variable resistors connected between said outputs of said second stage and said inputs of said third stage.

51. The invention of claim 50 wherein said pair of variable capacitors each comprise a network having a plurality of capacitors connected to a plurality of capacitor affiliated transistors, wherein capacitance of a circuit path of said amplifier is controlled by selectively and sequentially varying biasing conditions for said capacitor affiliated transistors to control an effective resistance of said capacitor affiliated transistors, wherein said capacitance is added in proportion to a current allowed by said effective resistance of said capacitor affiliated transistors.

52. The invention of claim 51 wherein said pair of variable resistors each comprise a network having a plurality of resistors connected to a plurality of resistor affiliated transistors, wherein resistance of a circuit path of said amplifier is controlled by selectively and sequentially varying biasing conditions for said resistor affiliated transistors to control an effective resistance of said resistor affiliated transistors.

53. The invention of claim 50 wherein said third pair of transistors are bipolar transistors.

54. The invention of claim 50 wherein said third pair of transistors are FETs.

55. The invention of claim 52 wherein said pair of variable capacitors and said pair of variable resistors are configured as a high pass filter to selectively control said high frequency response.

56. The invention of claim 55 wherein said pair of variable capacitors and said pair of variable resistors are varied so as to selectively control a center frequency of said high pass filter, wherein said selected center frequency encompasses a signal of interest.

57. The invention of claim 36 constructed substantially on a single integrated circuit substrate.

58. The invention of claim 38 constructed substantially on a single integrated circuit substrate.

59. The invention of claim 39 constructed substantially on a single integrated circuit substrate.

60. The invention of claim 55 constructed substantially on a single integrated circuit substrate.

61. The invention of claim 52 constructed substantially on a single integrated circuit substrate.

62. A method of adjusting a gain of a variable gain amplifier, wherein said amplifier includes at least two stages, said method comprising the steps of:
adjusting a pair of variable common resistors of a first stage and a pair of variable load resistors of a second stage to selectively vary said gain while maintaining a constant Third-Order Intercept Point (IP3);
changing a variable capacitance in order to selectively vary a high frequency cut-off point to adjust said bandwidth; and modifying biasing conditions for each of said transistor pairs responsive to a varying amplifier current.

63. The method of claim 62 wherein said variable common resistors and said variable load resistors each comprise a network having a plurality of resistors connected to a plurality of associated transistors, said adjusting step comprising the step of:

selectively and sequentially controlling operating conditions for each of said associated transistors in order to vary an effective resistance of said associated transistors.

64. The method of claim 63 wherein input signals require maintaining a constant input IP3 (IIP3).

65. The method of claim 63 wherein input signals require maintaining a constant output IP3 (OIP3).

66. The method of claim 64 wherein each of said transistor pairs comprises bipolar transistors, said adjusting step further comprising the steps of:

maintaining a pair of variable emitter resistors of said first stage at a constant value; and adjusting a pair of variable collector resistors of said second stage.

67. The method of claim 65 wherein each of said transistor pairs comprises bipolar transistors, said adjusting step further comprising the steps of:

maintaining a pair of variable collector resistors of said second stage at a constant value; and adjusting a pair of variable emitter resistors of said first stage.

68. The method of claim 64 wherein each of said transistor pairs comprises field effect transistors (FET), said adjusting step further comprising the steps of:

maintaining a pair of variable source resistors of said first stage at a constant value; and adjusting a pair of variable drain resistors of said second stage.

69. The method of claim 65 wherein each of said transistor pairs comprises FETs and, said adjusting step further comprising the steps of:

maintaining a pair of variable drain resistors of said second stage at a constant value; and adjusting a pair of variable source resistors of said first stage.

70. The method of claim 62 wherein said variable capacitance comprises networks having a plurality of capacitors connected to a plurality of capacitance associated transistors, said changing step comprising the step of:

selectively and sequentially controlling the operating conditions of said capacitance associated transistors so as to vary an effective resistance of said capacitance associated transistors, wherein said capacitance is changed in proportion to a current controlled by said effective resistance.

71. The method of claim 63 wherein said variable capacitance and said variable common resistors are controlled by identical operating conditions configured to increase capacitance in unison with decreasing common resistance and to decrease capacitance in unison with increasing common resistance.

72. The method of claim 62 further comprising the steps of:

filtering outputs of said second stage in a third stage to further adjust said bandwidth; and buffering said outputs through a pair of transistors in said third stage, wherein said filtering step is performed by a pair of adjustable capacitors of said third stage connected to a pair of adjustable resistors of said third stage.

73. The method of claim 72 further comprising the steps of:

selectively and sequentially varying said adjustable capacitors of said third stage; and selectively and sequentially varying said adjustable resistors of said third stage in order to control said bandwidth.

74. The method of claim 73 wherein said adjustable capacitors of said third stage each comprise a network having a plurality of capacitors connected to a plurality of capacitor corresponding transistors, said filtering step further comprising the step of:

selectively and sequentially controlling operating conditions of said capacitor corresponding transistors so as to vary an effective resistance of said capacitor corresponding transistors, wherein said capacitance is changed in proportion to a current controlled by said effective resistance.

75. The method of claim 74 wherein said adjustable resistors of said third stage each comprise a network having a plurality of resistors connected to a plurality of resistor corresponding transistors, said filtering step further comprising the step of:

selectively and sequentially controlling operating conditions of said resistor corresponding transistors so as to vary an effective resistance of said resistor corresponding transistors.

* * * * *